United States Patent [19]

Demmer et al.

[11] Patent Number: 4,499,427
[45] Date of Patent: Feb. 12, 1985

[54] DIGITAL FM DEMODULATOR USING A FILTER HAVING A LINEARLY SLOPING FREQUENCY-AMPLITUDE CHARACTERISTIC

[75] Inventors: Walter Demmer; Rolf D. Gutsmann; Jürgen Lenth, all of Hamburg, Fed. Rep. of Germany

[73] Assignee: U.S. Philips Corporation, New York, N.Y.

[21] Appl. No.: 392,099

[22] Filed: Jun. 25, 1982
(Under 37 CFR 1.47)

[30] Foreign Application Priority Data

Jun. 25, 1981 [DE] Fed. Rep. of Germany ....... 3124963

[51] Int. Cl.³ ........................ H03D 3/06; H03K 9/06
[52] U.S. Cl. .................................. 329/107; 329/126; 329/137; 329/145; 375/82
[58] Field of Search ............... 329/104, 107, 126, 137, 329/145; 375/80, 82

[56] References Cited

U.S. PATENT DOCUMENTS 3,324,400 6/1967 Battail et al. .................... 329/145 X
3,813,617 5/1974 Blancheville et al. ........... 329/145 X

*Primary Examiner*—Siegfried H. Grimm
*Assistant Examiner*—D. C. Mis
*Attorney, Agent, or Firm*—Thomas A. Briody; William J. Streeter; Edward W. Goodman

[57] ABSTRACT

A frequency-modulated input signal is converted at an adequately high sampling rate into a time-discrete and amplitude-discrete digital signal. This digital signal is applied to a simple transversal filter, having a sloping amplitude characteristic, more specifically having a $sin^2$ transfer function and a constant group delay time, and to a delay device having a time delay which is equal to the group delay time. The output signal of the filter is applied to a numerator input of a divider (6) and the output signal of the delay device to a denominator input the divider (6) whose quotient contains the frequency corresponding to the amplitude characteristic of the filter. In this manner, a frequency demodulator having a very good AM-suppression and an adequate linearity at broad-band-FM is realized. The divider is formed, in accordance with the "pipeline principle", from a plurality of identically constructed sections corresponding to the number of bit positions of the processed digital signals. As a result thereof a sufficiently high processing speed can be accomplished with very little cost. A correction circuit is provided to avoid faults and inaccuracies, respectively, in the case of small denominators.

10 Claims, 3 Drawing Figures

DIGITAL FM DEMODULATOR USING A FILTER HAVING A LINEARLY SLOPING FREQUENCY-AMPLITUDE CHARACTERISTIC

BACKGROUND OF THE INVENTION

The invention relates to an arrangement for demodulating a frequency-modulated input signal by means of a filter which, in the range of the possible frequencies of the input signal, has a sloping frequency-amplitude characteristic.

Arrangements of this type are required to convert a frequency-modulated signal in the baseband, that is to say to recover the original information. Frequency-modulated signals are used in, for example, color television techniques, inter alia for the two chrominance signals in the SECAM-method and in magnetic picture recording, the luminance signal being converted into a frequency-modulated signal and being recorded in this form on the magnetic tape. This usually relates to what is commonly referred to as broadband frequency modulation, in which the maximum frequency swing is of the order of magnitude of the center frequency of the frequency-modulated signal.

An arrangement of the type described in the opening paragraph is known, for example from "Elektronik-Arbeitsblätter", Franzis-Verlag, Munich. In these prior art arrangements, the filter is constructed by means of coils and capacitors, for example, for use as a resonant circuit. Such circuits are indeed relatively simple but the results obtained therewith cannot satisfy more stringent requirements; more specifically an arrangement having a resonant circuit is not suitable for broadband frequency modulation. Difficulties are also encountered when the usual signal in the baseband, that is to say the modulating frequency, extends to near the center frequency of the frequency-modulated signal. Quite a number of other circuits for frequency demodulation are known, for example push-pull discriminators or ratio detectors, which indeed produce very satisfactory results, particularly at narrow-band frequency modulation, but they all use coils and capacitors and consequently cannot be manufactured in integrated circuit technology.

In substantially all the known frequency demodulator circuits, a limiting amplifier precedes the frequency demodulator circuits, which limiting amplifier has for its object to prevent the demodulated signal from being affected by amplitude demodulation of the frequency-modulated signal as a result of disturbances. This limiting function can also be given to the demodulator itself, for example to the ratio detector.

SUMMARY OF THE INVENTION

The invention has for its object to provide an arrangement of the type defined in the opening paragraph which can be fully manufactured by means of integrated circuit technology and which accomplishes good linearity of the demodulation with a higher AM-suppression, also at broad-band frequency modulation with relatively high frequencies of the information signal. According to the invention, this object is accomplished in that for demodulation with digital components, a sampling device generates digital sampling values from the input signal at uniformly distributed instants, that the output of the sampling device is connected to the input of the filter, which is in the form of a digital transversal filter having a constant group delay time, and also to the input of a delay device having a time delay equal to the group delay time of the filter, and that the output of the filter is connected to a numerator input of a divider and the output of the delay device is connected to a denominator input of the divider, which produces a sequence of digital words which indicates the variation of the instantaneous frequency of the input signal. By using exclusively digital components, the arrangement in accordance with the invention can be manufactured in accordance with integrated circuit technology without any further measures. The sequence of digital words produced by the divider can be directly processed as a digitized demodulated signal, or the digital words may be converted into an analog demodulated signal by means of a digital-to-analog converter and a low-pass filter. The sampling device comprises, for example, an analog-to-digital converter which may be followed by still further components for preprocessing the digital sampling values, such as, for example, a filter, which is however not important for the present invention, it only being of importance that time-discrete digital signals derived from the input signal are derived.

For a practical embodiment it is efficient that the delay device comprises a series arrangement of several clock generator-controlled register stages, and that the digital transversal filter is connected to terminals of the register stages. In this manner, the delay device is also employed for the transversal filter, so that a simple and compact construction is possible.

The divider may have different constructions, for example its denominator input may be followed by an arrangement for forming the reciprocal value, which efficiently is in the form of a read-only memory, and the output of this read-only memory and the filter are connected to a multiplier which can be constructed for high processing rates at an acceptable cost. A further construction of the divider is characterized, in accordance with a further embodiment of the invention, in that the divider has sections, each having two inputs and three outputs, each section comprising:

a subtracting stage subtracting the value applied to the first input from the value applied to the second input and applying the difference between these two values to a differential output and the sign to a sign output which is connected to the first output, a change-over switch which, when the sign at the sign output of the subtracting stage is positive, connects the differential output, and when the sign is negative the second input, to its output, a first intermediate store connected to the output of the change-over switch, this intermediate store being connected to the second output via a multiplier, a second intermediate store connected to the first input and to the first output, both intermediate stores being controlled by the clock pulse generator, that the first input of the first section is coupled to the output of the delay device and the second input of the first section is coupled to the output of the filter and the first and second input, respectively, of each section is connected to the first and second input, respectively, of each subsequent section and the third output of each section is connected to a shift register which is controlled by the clock pulse generator, the number of stages of this shift register corresponding to the number of sections arranged subsequent to the sections associated with this shift register, the series outputs of all shift registers supplying digital words which designate the instantaneous frequency of the input signal. Such a divider operates in accordance with the "pipeline" principle in which the information is shifted stepwise and consequently appears at the output with a constant delay. A section is assigned to each bit of the digital words appearing at the output of the divider, these bits being delayed to such an extent by the subsequent shift registers that the bits of the digital words appear in parallel. As the consequent shift in the time is constant for all digital words, it has no effect on the demodulated signal.

A divider of such a construction only processes numbers without sign. It is therefore efficient to connect the first section of the divider to the output of the filter and to the output of the delay device, each via an amount former. This simplifies the construction of the individual sections.

As a divider may overflow at very low values of the denominator, that is to say the quotient exceeds the value range of the divider and all the supplied bits of the quotient comprise the logical value "1", or that at a simultaneously low value of the numerator, a very inaccurate result is obtained, as the quantizing errors contained in the dividend and in the denominator have a very strong effect, the quotient produced in these cases by the divider must be corrected. A further embodiment of the invention is therefore characterized in that the output of the divider is followed by a correction circuit which replaces the binary number produced by the divider as the quotient by the mean value of the chronologically immediately preceding and immediately following binary number when the denominator associated with the instantaneously used binary number falls short of a predetermined value. As at a periodic input signal such a case normally only occurs at one input signal value out of several consecutive input signal values, and, on the other hand, the frequency of the input signal does not essentially change between two sampling values, no important error is produced by this use of the mean value instead of the correct quotients.

Such a correction circuit is preferably characterized in that it comprises:

a delay circuit formed by two series-arranged register stages which delay the binary word applied to the quotient input by two clock pulse periods of the clock pulse generator, an adder connected to the input and to the output of the delay circuit, a comparator connected to the denominator input of the correction circuit, which comparator compares the binary number applied to the denominator input with an adjustable threshold value-binary number and produces a signal having one of the logic values when the applied binary number is less than the threshold value-binary number, a change-over switch controlled by the comparator via a delay stage having a time delay of one clock pulse period of the clock pulse generator, which change-over switch connects, at one logic value of the output signal of the comparator, the output of the adder and at the other logic value, the junction point of the two registers of the delay circuit, to the output of the correction circuit.

In this manner the quotient can be easily replaced by the mean value of the adjacent quotient when the values of the denominator are too low.

DESCRIPTION OF THE DRAWINGS

Embodiments of the invention will now be further described by way of example with reference to the accompanying drawings. Herein.

DESCRIPTION OF THE PREFERRED EMBODIMENTS

Figure 1:
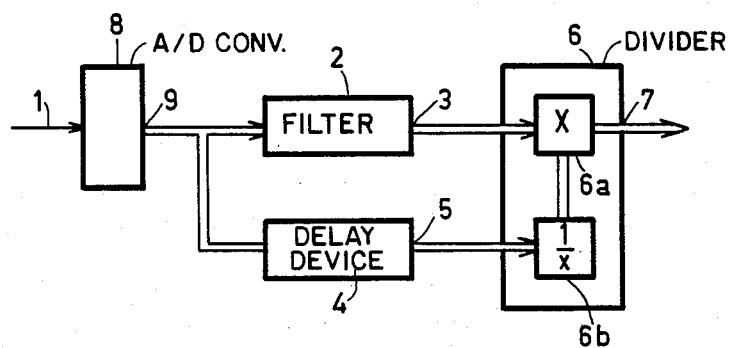
FIG. 1 shows a block schematic circuit diagram of a demodulation arrangement in accordance with the invention.

The block diagram in FIG. 1 shows a sampling arrangement 8, which receives a frequency-modulated signal via the input 1 and is preferably in the form of an analog-to-digital converter. This sampling device 8 samples the analog signal applied to the input 1 at uniformly distributed instants which are determined by a clock pulse generator, not shown. Each sampling value is applied to the input 9 in the form of a multi-bit binary word whose individual bits are transferred in parallel as indicated by the connection represented by means of a double line, which connection is actually formed by a plurality of individual conductors.

The binary words produced at the output 9 are simultaneously applied to a filter 2 and to a delay device 4. The filter 2 is a digital transversal filter having a transfer characteristic $A(\omega)$ which, at least in the range of possible frequencies of the frequency-modulated signal applied via the input 1, has a characteristic which is linear to the best possible extent, as well as a constant group delay time. As a result thereof, at the output 3 of the filter 2, a sequence of binary words is produced which occur in the same sequence as the binary words at the output 9 and represent sampling values of a correspondingly filtered analog signal. In the delay device 4, the binary words occurring at the output 9 are delayed by a period of time which is equal to the group delay time of the filter 2, so that binary words which correspond to the binary words which simultaneously occur at the output 3 of the filter 2 but which represent sampling values of the nonfiltered input signal, occur at the output 5.

The binary words occurring at the outputs 3 and 5, respectively are now applied to the divider 6 in which each binary word occurring at the output 3 is divided by the binary word which simultaneously occurs at the output 5, and each quotient appears at the output 7. The relationship between the signal $U_a$, which is formed by the sequence of binary words supplied from the output 7, and the input signal $U(t) \sin \omega t$ applied to the input 1 is then as follows:

$$U_a = \frac{U(t) \cdot \sin\omega t \cdot e^{-j\omega\tau} \cdot A(\omega)}{U(t) \cdot \sin\omega t \cdot e^{-j\omega\tau}} = A(\omega),$$

wherein $\tau$ is the group delay time of the filter 2.

So this output signal $U_a$ represents the instantaneous frequency of the input signal and is fully independent of the amplitude of this input signal. If it holds for the amplitude transfer function that $$A(\omega) = K1 + K2 \cdot \omega,$$

then the output signal $U_a$ is accurately proportional to the frequency of the input signal. Such a transfer function cannot however be obtained at low cost. A proper approximation of its ideal transfer function is, however, formed for many uses by a $\sin^2$-transfer function which can be produced in a considerably simpler way as will be described hereafter. Further transfer functions for the filter 2 are however additionally possible bymeans of which it is, for example, possible to accomplish, at the same time, a frequency response correction.

The fact that with a denominator having the value zero an overflow in the divider occurs which might result in a faulty result, must be taken account of. Consequently, a further device which tests whether the value of the denominator is equal to zero must be provided in the divider 6. In that case, the result of the division is not used but rather, for example, the mean value from the preceding and the subsequent results of the division. Also when both the numerator and the denominator, that is to say the binary words which occur at the outputs 3 and 5, have simultaneously very low values, also when they are not yet zero, corresponding measures must be taken.

In FIG. 1 the divider 6 comprises a reciprocal value former 6b formed by a read-only memory, each memory address of which comprises a binary word which corresponds to the reciprocal of the address. This reciprocal value is applied to a multiplier 6c which furthermore directly receives the binary word supplied from the output 3. Then binary words occur at the output 7 with a value which is equal to the quotient of the two binary words which simultaneously occur at the outputs 3 and 5.

Figure 2:
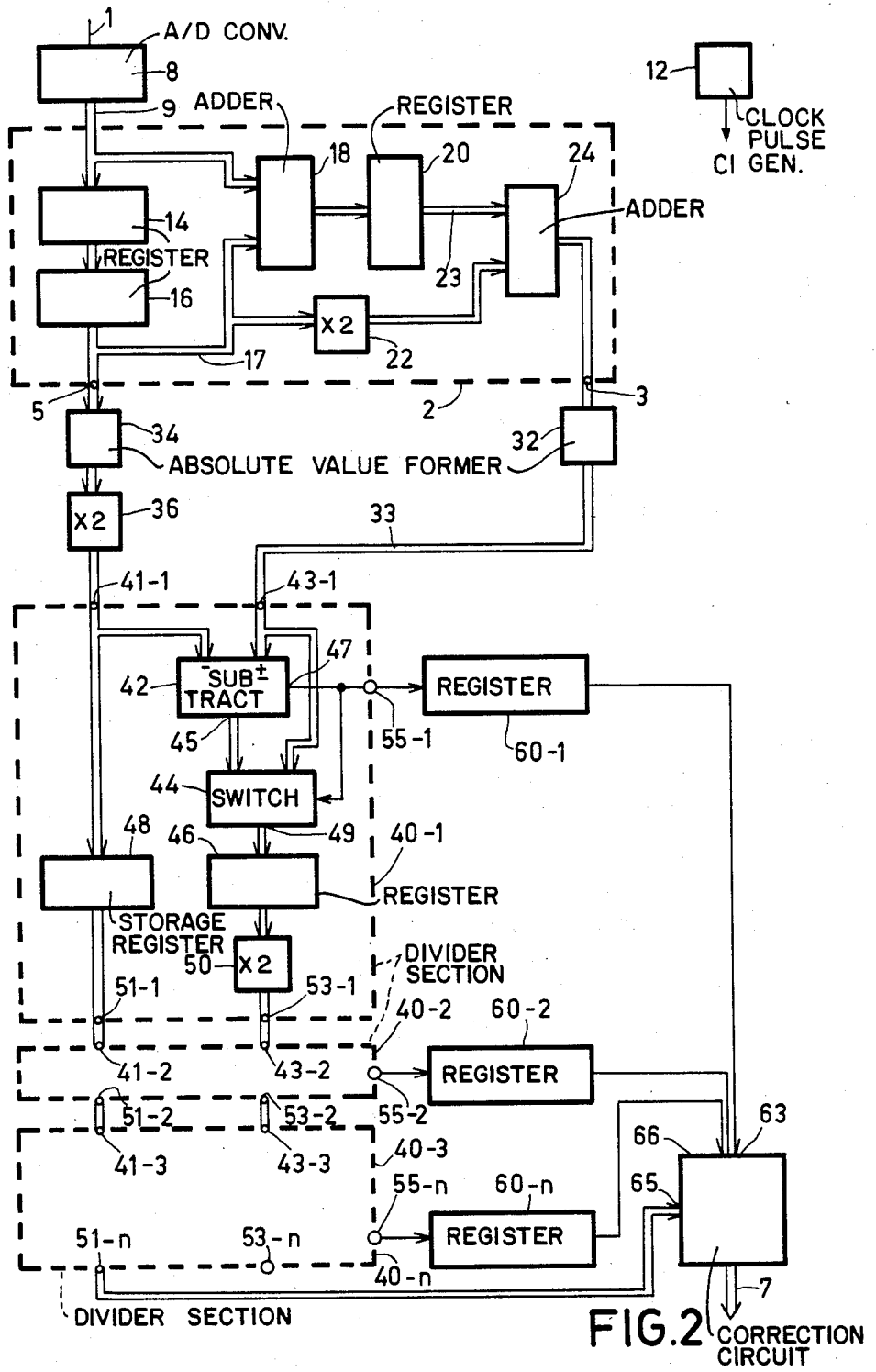
FIG. 2 shows a detailed block schematic circuit diagram of such an arrangement incorporating a particularly simple and fast divider.

The blocks shown in FIG. 1 are shown in greater detail in FIG. 2. The digital sampling values of the analog signal which are applied to the input 1, which digital sampling values are produced at the output 9 of the sampling device 8, are applied to a series arrangement of two register stages 14 and 16 which, at each clock pulse C1 of the clock pulse generator 12, take over the binary word present at the input. This also holds for the further register stages in FIG. 2 and also for the sections 60-1 to 60-n, so that the clock pulse conductor is not shown for the sake of clarity. Thus, the two register stages 14 and 16 form a delay device having a time delay of two pulse periods of the clock pulse generator 12. The delayed binary words are supplied at the output 5.

The binary words occurring at the output 9 and also at the output 5 of the conductor 17 are applied to the two inputs of an adder stage 18, whose output is connected to a register stage 20. The output line 23 of this register stage, which produces a delay by one clock pulse period, is connected to one input of a further adder stage 24 whose other input is connected to the conductor 17 via a multiplier 22 having a multiplication factor 2, which can be realized in the simplest manner by shifting the position of the applied binary number one bit. The output of the adder stage 24 is connected to the output 3 of the filter 2, which here, because of the fact that the register stages 14 and 16 have a double function also comprises the delay device 4 of FIG. 1. There now is a relationship between the signals at the output 9 and at the output 3 in accordance with the following transfer function $$H(Z) = (1 - Z^{-1})^2$$

having the amplitude response $$A(\omega) = 4 \cdot \sin^2 \frac{1}{2}(2\omega/\omega_T \pi),$$

wherein $\omega_T = 2\pi \cdot f_T$ and $f_T$ is the pulse frequency C1 of the clock pulse generator 12.

So the filter 2 in FIG. 2 has a response curve which has a maximum at an input signal having a frequency equal to half the clock pulse frequency. At one-quarter of the clock pulse frequency, the curve has a point of inflection and on either side of this point of inflection it has an approximately linear variation.

In a practical example of use in a video magnetic tape apparatus, the luminance signal to be recorded has a signal bandwidth of approximately 2.7 MHz. The input signal which is modulated therewith and is applied to the input 1 of the arrangement shown in FIGS. 1 and 2, respectively, has a frequency range from 3.3 MHz to 4.8 MHz, the higher value corresponding to the peak white. At a clock pulse frequency of 17.73 MHz, the frequency range of this input signal is located in a predominantly linear range of the response curve of the filter 2.

As the subsequent divider, which is formed by the sections 40-1 to 40-n, only processes figures without sign, the output 3 of the filter 2 is followed by an absolute value former 32 and the output 5 of the delay arrangement is followed by a further absolute value former 34, which preferably has the same construction. These absolute value formers 32 and 34 are however, only required when it is assumed that negative figures occur at the outputs 3 and 5, respectively, in a two's-complement representation. In an embodiment in which the figures occur as absolute values with an additional sign bit it will be obvious that then only the sign bit must be separated in the absolute value formers 32 and 34.

For an optimal use of the value range of the divider, an input frequency of 4.43 MHz, in accordance with the practical example mentioned in the foregoing, must correspond to half the swing of the output signal of the divider. As, on the other hand, at this frequency, owing to the construction of the filter 2, the signals produced at the outputs 3 are doubled compared with the signal supplied at the output 9, also the signals occurring at the output 5 of the delay device are doubled if the divider is preceded by a multiplier 36 having a multiplying factor 2. This multiplication by a factor 2 can be accomplished in a very simple manner by a positioned shift over 1 bit, in the same was as at the multiplier 22.

The divider is formed by the series arrangement of a number of sections 40-1 to 40-n, which are of a mutually equal construction so that here only the first section 40-1 is shown in detail. The binary words which are applied to the input 41-1 and are derived from the binary words produced at the output 5 of the delay device and represent the denominator are applied to the input of a storage register 48 and to the subtracting input of a subtractor 42. The binary words which are applied to the second input 43-1 via the connection 33 and are derived from the output 3 of the filter 2, are applied to the plus input of the subtractor 42 and also to an input of a change-over switch 44. The other input of the change-over switch 44, which efficiently is constructed as an electronic multiple-contact change-over switch or as a multiplexer, is connected to the output 45 of the subtractor 42. When the binary number applied to the second input 43-1 is greater than or equal to the binary number applied to the first input 41-1, then the subtractor 42 produces, at the sign output 47, a logic "1" which is fed out at the output 55-1 and which so changes over the change-over switch 44 that the output 45 of the subtractor 42 is connected to the output 49 of the change-over switch 44. If, in contrast therewith, the binary number applied to the input 41-1 is greater, then the subtractor 42 produces at the sign output 47, a logic "0" which so changes over the change-over switch 44 that its output 49 is connected to the second input 43-1.

The output 49 of the change-over switch 44 is connected to the input of a register stage 46 which is clocked in parallel with all the other register stages and consequently also in parallel with the register stage 48, so that the respective binary words appear simultaneously at the outputs 51-1 and 53-1, the register stage 46 only being followed by a multiplier 50 which has a multiplying factor 2 which factor is again realized by a positional shift of one bit.

The binary numbers appearing at the outputs 51-1 and 53-1 of the section 40-1 are now applied to the inputs 41-2 and 43-2, respectively, of the next section 40-2 and processed in a similar manner. The sign signals supplied by the subtractor, not shown, incorporated in this section 40-2 are fed out again via the output 55-2. The binary words occurring at the outputs 51-2 and 53-2, which words have been delayed by a further clock phase in addition to the arithmetical processing in one branch, are applied to the inputs 41-3 and 43-3, respectively, of the next section 40-3, etc. Now the individual bits of the quotients formed in the divider occur at the outputs 55-1 to 55-n, more specifically, the most significant bit at the output 55-1 and, at the corresponding outputs of the next sections, the bits of a decreasing significance, however delayed from section to section by one clock pulse of the clock pulse generator 12. For that purpose the outputs 55-1 to 55-n are connected to the respective series input of the shift registers 60-1 to 60-n. The shift register 60-1 has n stages, the shift register 60-2 has n-1 stages, etc. until shift register 60-n which has only one single stage. All the shift registers receive the clock pulse Cl from the clock pulse generator 12 as the shift pulse. In this manner the individual bits of one specific quotient occur in parallel at the output of the shift registers 60.

The second output 53-n of the last section 40-n is not connected, while the first output 51-n of the last section 40-n, which produces a binary number corresponding to the denominator which simultaneously occurs at the outputs of the shift register 60-1 to 60-n and which is associated with the quotient, is connected to an input 65 of a correction circuit 66, which further has a quotient input 63 which receives, in parallel, the series output signals supplied by the shift registers 60-1 to 60-n as bits of a binary word. This correction circuit 66 replaces the binary number supplied by the shift registers 60-1 to 60-n by the mean value of the chronologically immediately preceding and immediately following binary numbers when the binary number occurring at the output 51-n falls short of a predetermined value.

Figure 3:
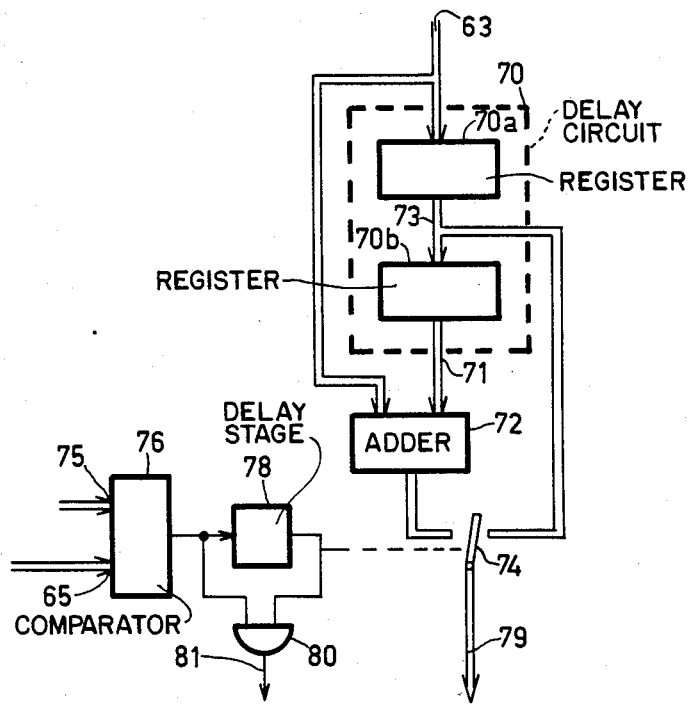
FIG. 3 shows the block schematic circuit diagram of a correction circuit.

An example of such a correction circuit is shown in FIG. 3. The binary number applied to the quotient input 63 is applied to one input of an adder 72 and also to a delay circuit 70, which comprises two series arranged register stages 70a and 70b which are controlled in parallel by the clock pulse Cl of the clock pulse generator 12 of FIG. 2. The output 71 of the delay circuit 70 is connected to the other input of the adder 72. The junction 73 between the two register stages 70a and 70b is connected to one input of a change-over switch 74, whose other input is connected to the output of the adder 72. Efficiently, the change-over switch 74 is in the form of an electronic change-over switch, that is to say in the form of a multiplexer having a number of inputs and outputs corresponding to the number of position of the processed binary numbers.

The input 65 of the correction circuit 66 for the denominator is connected to one input of a comparator 76 whose other input 75 receives an adjustable threshold value-binary number. When the binary number applied to the input 65 is smaller than the threshold value-binary number, that is to say the denominator, which is associated with the quotient which is simultaneously present on the input 63, is below the threshold determined by the threshold value-binary number, the comparator 76 provides an output signal having, for example, the logic value "1". The output of the comparator 76 is connected to a delay stage 78 which may be in the form of a flip-flop and to which also the clock signal Cl of the clock pulse generator 12 of FIG. 2 is applied. So when the comparator 76 produces an output signal "1", this output signal appears, delayed by one clock period, at the output of the delay stage 78. At this instant the binary number at the input 63, which is associated with a quotient having too low a denominator value, has arrived at the output of the register stage 70a. So at this instant, the adder 72 receives the binary number which immediately precedes and the binary number which immediately follows this quotient and forms the sum thereof and divides this sum by the factor 2 for forming a mean value, which can be effected by means of a simple bit shift by a corresponding connection of the output of the adder 72, not shown. Simultaneously, the change-over switch 74 is adjusted to the left-hand position so that, instead of the quotient having the denominator value which is too low, the mean value of the two adjacent quotients appears at the output 79. It is a condition that the binary number which simultaneously appears at the input 65 and which corresponds to the denominator is greater than the threshold value-binary number at the input 75 of the comparator 76, so that this comparator supplies a logic "0" as the output signal. The case in which several consecutive denominator values of too low a value occur will be described hereinafter.

With the next clock signal Cl of the clock pulse generator 12 in FIG. 2, the incorrect quotient with the denominator of too low a value at the output 71 of the delay circuit 70 is shifted further, while the quotient subsequent to this incorrect quotient appears at the junction 73 between the two register stages 70a and 70b and consequently at the right-hand input of the change-over switch 74. Simultaneously, the delay stage 78 has taken over the preceding output signal "0" of the comparator 76 and supplies it from the output so that the change-over switch 74 is again switched to the right-hand position and as a result thereof the quotient which follows after the incorrect quotient appears at the output 79. So as a result thereof only the incorrect quotient is replaced by the mean value of the preceding and the subsequent quotients.

In the case that at least two immediately consecutive denominators have a value which is too low, this is an indication that the signal has briefly disappeared, i.e. there is what is commonly referred to as a "dropout". In this case a signal "1" is simultaneously present on the outputs of the delay stage 78 and the comparator 76, so that an AND-gate 80, whose inputs are connected to these two outputs, supplies a logic "1" from its output 81. This signal is applied to a further correction circuit, not shown for compensating for such drop-outs which, for example, inserts in these positions the corresponding values of the preceding lines when the signal is used in a video-magnetic tape apparatus.

As the lowest prevailing frequency of the input signal applied to the input 1 differs from zero, the binary numbers supplied from output 7, and which indicate the frequency of this input signal, are also located in a range which is shifted with respect to the zero value. When the above-mentioned example of the video-magnetic tape apparatus is the starting point, in which the frequencies of the input signal are located in a range from 3.3 MHz and 4.8 MHz and the clock frequency of the clock pulse generator 12 has a value of 17.73 MHz, and it being assumed that the binary numbers appearing at the output 9 of the sampler 8 have a length of 8 bits, binary numbers are produced at the output 7 which, at an input signal of 3.3 MHz, have, expressed in decimals, a value of 79 and at 4.8 MHz, a value of 146. The difference between these two values is 67, so that the definition of the output signal at the output 7 is better than 6 bits but is shifted, expressed in decimals, by the value 79. To relate the output signal of the overall demodulation arrangement to the value zero, which simplifies the further signal processing, more specifically, the subsequent reconversion into an analog signal, a subtractor, not shown, may be provided subsequent to the output 7 in FIG. 2, which subtractor subtracts from each binary number occurring at the output 7 the corresponding minimum value.

What is claimed is:

1. An arrangement for demodulating a frequency-modulated input signal by means of a filter which, in a range of the possible frequencies of the input signal, has a sloping frequency-amplitude characteristic, characterized in that for demodulation with digital components, a sampling device generates digital sampling values from the input signal at uniformly distributed instants, that an output of the sampling device is connected to an input of a filter, which is in the form of a digital transversal filter having a constant group delay time, and also to an input of a delay device having a time delay equal to the group delay time of the filter, and that an output of the filter is connected to a numerator input of a divider and an output of the delay device is connected to a denominator input of the divider, said divider producing a sequence of digital words, said sequence indicating the variation of the instantaneous frequency of the input signal.

2. An arrangement as claimed in claim 1, characterized in that the delay device comprises a series arrangement of several register stages which are controlled by a clock pulse generator, and that the digital transversal filter is connected to terminals of the register stages.

3. An arrangement as claimed in claim 1 or 2, characterized in that the divider has a plurality of sections each having a denominator and a numerator input and three outputs, each of these sections comprising:

a subtracting stage which subtracts a value applied to the denominator input from a value applied to the numerator input and applies the difference between the two values to a differential output and the sign to a sign output which is connected to a third of said three outputs, a change-over switch, which, at a positive sign at the sign output of the subtracting stage, connects the differential output, and at a negative sign, the numerator input to an output thereof, a first intermediate store which is connected to the output of the change-over switch and, via a multiplier, to a second of said three outputs, a second intermediate store connected to the denominator input and to a first of said three outputs, the two intermediate stores being controlled by the clock pulse generator, that the denominator input of a first of said sections is coupled to the output of the delay device and the numerator input of the first section is coupled to the output of the filter, and the first and second outputs, respectively, of each section are connected to the denominator and the numerator inputs, respectively, of each following section and the third output of each section is connected to a respective shift register, each shift register being controlled by the clock pulse generator, the number of register stages in each shift register corresponding to the number of sections subsequent to the section associated with this shift register, a series output of all the shift registers supplying in parallel the digital words which indicate the instantaneous frequency of the input signal.

4. An arrangement as claimed in claim 3, characterized in that the first section of the divider is connected to the output of the filter and to the output of the delay device, each via respective absolute value formers.

5. An arrangement as claimed in claim 4, characterized in that a correction circuit, which replaces the binary number supplied as a quotient by the divider by the mean value of the chronologically immediately preceding and the chronologically immediately following binary number when the denominator associated with the instantaneously supplied binary number falls short of a predetermined value, is coupled to the output of the divider providing the sequence of digital words.

6. An arrangement as claimed in claim 5, characterized in that the correction circuit comprises:

a delay circuit, formed by two series-arranged register stages, which delays the binary number applied to a quotient input by two clock pulse periods of the clock pulse generator, an adder having a first input connected to the input of said delay circuit, a second input connected to an output of said delay circuit, and an output, a comparator which is connected to a denominator input of the correction circuit and which compares the binary number applied to the denominator input with an adjustable threshold value-binary number and produces a signal having one logic value when the applied binary number is smaller than the threshold value-binary number, and a change-over switch which is controlled by the comparator via a delay stage having a time delay of one clock pulse period of the clock pulse generator and which, at one logic value of the output signal of the comparator, connects the output of the adder, and, at the other logic value, a junction between the two register stages of the delay circuit, to an output of the correction circuit.

7. An arrangement as claimed in claim 3, characterized in that a correction circuit, which replaces the binary number supplied as a quotient by the divider by the mean value of the chronologically immediately preceding and the chronologically immediately following binary number when the denominator associated with the instantaneously supplied binary number falls short of a predetermined value, is coupled to the output of the divider providing the sequence of digital words.

8. An arrangement as claimed in claim 7, characterized in that the correction circuit comprises:
- a delay circuit, formed by two series-arranged register stages, which delays the binary number applied to a quotient input by two clock pulse periods of the clock pulse generator;
- an adder having a first input connected to the input of said delay circuit, a second input connected to an output of said delay circuit, and an output,
- a comparator which is connected to a denominator input of the correction circuit and which compares the binary number applied to the denominator input with an adjustable threshold value-binary number and produces a signal having one logic value when the applied binary number is smaller than the threshold value-binary number, and
- a change-over switch which is controlled by the comparator via a delay stage having a time delay of one clock pulse period of the clock pulse generator and which, at one logic value of the output signal of the comparator, connects the output of the adder, and, at the other logic value, a junction between the two register stages of the delay circuit, to an output of the correction circuit.

9. An arrangement as claimed in claim 1 or 2, characterized in that a correction circuit, which replaces the binary number supplied as a quotient by the divider by the mean value of the chronologically immediately preceding and the chronologically immediately following binary number when the denominator associated with the instantaneously supplied binary number falls short of a predetermined value, is coupled to the output of the divider providing the sequence of digital words.

10. An arrangement as claimed in claim 9, characterized in that the correction circuit comprises:
- a delay circuit, formed by two series-arranged register stages, which delays the binary number applied to a quotient input by two clock pulse periods of the clock pulse generator,
- an adder having a first input connected to the input of said delay circuit, a second input connected to an output of said delay circuit, and an output,
- a comparator which is connected to a denominator input of the correction circuit and which compares the binary number applied to the denominator input with an adjustable threshold value-binary number and produces a signal having one logic value when the applied binary number is smaller than the threshold value-binary number, and
- a change-over switch which is controlled by the comparator via a delay stage having a time delay of one clock pulse period of the clock pulse generator and which, at one logic value of the output signal of the comparator, connects the output of the adder, and, at the other logic value, a junction between the two register stages of the delay circuit, to an output of the correction circuit.

* * * * *

UNITED STATES PATENT AND TRADEMARK OFFICE
CERTIFICATE OF CORRECTION

PATENT NO. : 4,499,427

DATED : February 12, 1985

INVENTOR(S) : WALTER DEMMER ET AL

It is certified that error appears in the above-identified patent and that said Letters Patent is hereby corrected as shown below:

In the Title Page:

Item 22, delete "(Under 37 CFR 1.47)"

Signed and Sealed this

Twenty-sixth Day of November 1985

[SEAL]

Attest:

DONALD J. QUIGG

Attesting Officer

Commissioner of Patents and Trademarks